United States Patent [19]

Lockwood et al.

[11] 3,753,801

[45] Aug. 21, 1973

[54] METHOD OF DEPOSITING EXPITAXIAL SEMICONDUCTOR LAYERS FROM THE LIQUID PHASE

[75] Inventors: Harry Francis Lockwood, New York, N.Y.; Donald Paul Marinelli, Trenton, N.J.

[73] Assignee: RCA Corporation, New York, N.Y.

[22] Filed: Dec. 8, 1971

[21] Appl. No.: 206,056

[52] U.S. Cl. .................. 148/171, 148/1.5, 148/172, 252/62.3 GA, 118/415, 117/201

[51] Int. Cl. .......................... H01l 7/38, B05c 3/02

[58] Field of Search .................... 148/171, 1.5, 172, 148/173; 252/62.3 GA; 118/415; 23/273 SP, 301 SP; 117/201

[56] References Cited

UNITED STATES PATENTS

| | | | |
|---|---|---|---|
| 3,665,888 | 5/1972 | Bergh et al. | 148/171 X |
| 3,565,702 | 2/1971 | Nelson | 148/172 |
| 3,664,294 | 5/1972 | Solomon | 148/172 X |
| 3,631,836 | 1/1972 | Jarvela et al | 148/171 X |

*Primary Examiner*—G. T. Ozaki

*Attorney*—Glenn H. Bruestle

[57] ABSTRACT

One or more epitaxial layers of a semiconductor material are deposited on a substrate by providing for each epitaxial layer to be deposited a separate solution of a semiconductor material dissolved in a molten metal solvent. Each of the solutions is of a small volume and a weight is provided on each solution to spread the solution out in the form of a thin layer. The substrate is brought into contact with the solution and the solution is cooled to deposit the epitaxial layer on the substrate. Since the solution is in the form of a thin layer, only a minimum of platelets of the semiconductor material are formed in the solution during the deposition of the epitaxial layer so that the epitaxial layer has a smooth, even surface. To deposit a plurality of epitaxial layers on the substrate, the substrate is successively brought into contact with each solution which is then cooled to deposit an epitaxial layer. Each solution may be exactly saturated with the semiconductor material by bringing a body of semiconductor material into contact with the solution prior to bringing the substrate into contact with the solution.

16 Claims, 5 Drawing Figures

METHOD OF DEPOSITING EXPITAXIAL SEMICONDUCTOR LAYERS FROM THE LIQUID PHASE

BACKGROUND OF THE INVENTION

The invention herein disclosed was made in the course of or under a contract or subcontract thereunder with the Department of the Air Force.

The present invention relates to a method of depositing epitaxial layers of a semiconductor material by the liquid phase deposition technique, and more particularly to a method for depositing thin layers having smooth surfaces.

A technique which has come into use for making certain types of semiconductor devices, particularly semiconductor devices made of the group III-V semiconductor materials and their alloys, such as light emitting devices and transferred electron devices is known as "liquid phase epitaxy." Liquid phase epitaxy is a method for depositing an epitaxial layer of a single crystalline semiconductor material on a substrate wherein a surface of the substrate is brought into contact with a solution of a semiconductive material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxial layers can be deposited one on top of the other to form a semiconductor device of a desired construction including a semiconductor device having a PN junction between adjacent epitaxial layers of opposite conductivity type.

U.S. Pat. No. 3,565,702 to H. Nelson issued Feb. 23, 1971 entitled "Depositing Successive Epitaxial Semiconductive Layers From The Liquid Phase" describes a method and apparatus for depositing one or more epitaxial layers by liquid phase epitaxy and is particularly useful for depositing a plurality of epitaxial layers in succession. The apparatus includes a furnace boat of a refractory material having a plurality of spaced wells in its top surface and a slide of a refractory material movable in a passage which extends across the bottoms of the wells. In the use of this apparatus, a solution is provided in a well and a substrate is placed in a recess in the slide. The slide is then moved to bring the substrate into the bottom of the well so that the surface of the substrate is brought into contact with the solution. When the epitaxial layer is deposited on the substrate, the slide is moved to carry the substrate out of the well. To deposit a plurality of epitaxial layers on the substrate, separate solutions are provided in separate wells and the substrate is carried by the slide to each of the wells in succession to deposit the epitaxial layers on the substrate.

Heretofore, in depositing an epitaxial layer by the liquid phase epitaxy technique a large volume of the solution was used to assure good coverage of the entire surface on which the epitaxial layer was deposited. The use of a large volume of the solution creates certain undesirable effects. When the large volume of the solution is cooled, precipitation of the semiconductor material in the solution takes place throughout the solution. The semiconductor material which precipitates adjacent the surface of the substrate deposits thereon to form the epitaxial layer. However, the semiconductor material which precipitates in the portion of the solution spaced from the surface of the substrate forms platelets of the semiconductor material. These platelets can create local instabilities in the surface morphology of the substrate yielding an uneven surface of the epitaxial layer. Also, in the deposition of an epitaxial layer by the liquid phase epitaxy technique, the volume of the solution determines the thickness of the epitaxial layer which is deposited per degree reduction of the temperature of the solution. The greater the volume of the solution the thicker the epitaxial layer deposited per degree reduction of the temperature. Thus, with the use of a large volume of the solution it is difficult to control the decrease of the temperature of the solution precisely enough to deposit very thin epitaxial layers.

In order to prevent the formation of platelets so as to achieve epitaxial layers having smooth surfaces and to permit the deposition of thin epitaxial layers it would be desirable to use small volumes of the solutions. However, it has been found that to merely reduce the volume of the solution sufficiently to overcome the problems of the large volume is not satisfactory. It has been found that the surface tension of the materials generally used in the liquid phase epitaxy solutions causes the small volume of the solution to ball up into a spherical section so that the solution does not cover the entire surface of an average size substrate. Thus, the small volume solution would not deposit an epitaxial layer over the entire surface of the substrate.

SUMMARY OF THE INVENTION

An epitaxial layer of a semiconductor material is deposited on a substrate by forming in a confined space a solution of the semiconductor material dissolved in a molten solvent. A force is applied to a first surface of the solution so as to provide a thin layer of the solution. A surface of the substrate is brought into contact with a second surface of the solution layer which is opposite to the first surface of the solution layer. The solution is cooled to precipitate said semiconductor material in the solution and deposit the semiconductor material on the surface of the substrate.

DETAILED DESCRIPTION

Figure 1:
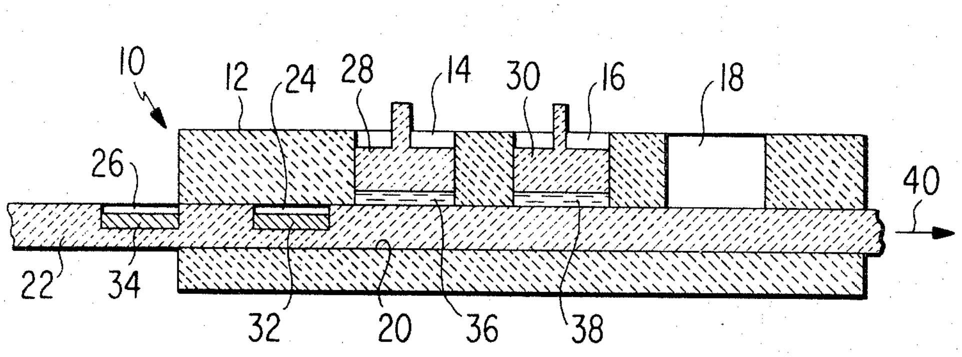
FIG. 1 is a cross-sectional view of an apparatus suitable for carrying out one embodiment of the method of the present invention.

Referring initially to FIG. 1, an apparatus suitable for carrying out one embodiment of the present invention is generally designated as 10. The apparatus 10 comprises a refractory furnace boat 12 of an inert, refractory material, such as graphite. The boat 12 has three, spaced wells 14, 16 and 18 in its upper surface. A passage 20 extends longitudinally through the boat 12 from one end to the other end and extends across the bottoms of the wells 14, 16 and 18. A slide 22 of a refractory material, such as graphite, movably extends through the passage 20 so that the top surface of the slide forms the bottom surfaces of the wells 14, 16 and 18. The slide 22 has a pair of spaced recesses 24 and 26 in its upper surface adjacent one end of the slide. The recesses 24 and 26 are spaced apart a distance substantially equal to the spacing between adjacent wells. Separate weights 28 and 30 are provided in the wells 14 and 16 respectively. The weights 28 and 30 are of an inert material, such as graphite or quartz, and are of a cross-sectional shape and size corresponding to that of the wells 14 and 16.

To carry out the one embodiment of the method of the present invention, a first charge is placed in the well 14 and a second charge is placed in the well 16. Each of the charges is a mixture of a semiconductor material of the epitaxial layer to be deposited, a metal solvent for the semiconductor material and, if the epitaxial layer is to be a particular conductivity type a conductivity modifier. For example, to deposit epitaxial layers of gallium arsenide, the semiconductor material would be gallium arsenide, the metal solvent would be gallium, and the conductivity modifier could be either tellurium or tin for an N type layer or zinc, germanium or magnesium for a P type layer. The semiconductor material and the conductivity modifier are present in granulated solid form at room temperature. Since certain of the metal solvents which can be used, such as gallium, have a melting temperature close to room temperature, the melting temperature of gallium being about 30°C, the metal solvent may be present either in granulated solid form or in liquid form depending on the ambient temperature where the method is being carried out. The proportions of the ingredients of each of the charges is preferably such that when the semiconductor material is dissolved in the molten metal solvent, the resulting solution will be unsaturated with the semiconductor material. Also, only a small volume of each of the charges is placed in each of the wells 14 and 16. By a small volume it is meant that the amount of each charge will provide a thin layer of the charge when spread over the entire bottom of its respective well. A body 32 of the same semiconductor material as contained in the charges is placed in the recess 24, and a flat substrate 34 of a material suitable for epitaxial deposition is placed in the recess 26. The recess 26 is large enough to allow the substrate 34 to lie flat therein. The weights 28 and 30 are placed in their respective wells 14 and 16 over the charges in the wells. If the metal solvent used in each of the charges is in a liquid form, the weights 28 and 30 apply a force on the charges which spreads the charges over the bottom of the wells to form thin layers of the charges. If the metal solvent used is in a solid form, this spreading will occur later as will be explained.

The loaded furnace boat 12 is then placed in a furnace tube (not shown) and a flow of high purity hydrogen is provided through the furnace tube and over the furnace boat 12. The heating means for the furnace tube is turned on to heat the contents of the furnace boat 12 to a temperature above the melting temperature of the ingredients of the charges, for example between 800°C and 950°C for gallium aluminum arsenide and gallium arsenide. This temperature is maintained long enough to insure complete melting and homogenization of the ingredients of the charges. If the metal solvent used in the charges was in solid form when placed in the wells, as it becomes molten upon heating, the force applied to the charges by the weights causes the molten charges to spread over the bottom surfaces of the wells to form thin layers. Thus, the charges become first and second solutions 36 and 38 of the semiconductor material and the conductivity modifier in the molten metal solvent. The small volume first and second solutions 36 and 38 are prevented from balling-up and are maintained as thin layers extending over the entire bottoms of the wells 14 and 16 by the force applied by the weights 28 and 30.

The slide 22 is then moved in the direction of the arrow 40 until the semiconductor material body 32 is within the well 14. This brings the body 32 into contact with the first solution 36. Since the first solution 36 is unsaturated with the semiconductor material, some of the semiconductor material of the body 32 will dissolve in the molten metal solvent until first solution is exactly saturated with the semiconductor material. The slide 22 is then again moved in the direction of the arrow 40 until the body 32 is within the well 16. This brings the body 32 into contact with the second solution 38. Since the second solution 38 is also unsaturated with the semiconductor material, some of the semiconductor material of the body 32 will dissolve in the molten metal solvent until the second solution is also exactly saturated with the semiconductor material.

Since the recess 26 which contains the substrate 34 is spaced from the recess 24 which contains the body 32 a distance equal to the spacing between adjacent wells, when the body 32 is moved from the first well 14 to the second well 16, the substrate 34 is simultaneously moved into the first well 14. This brings the surface of the substrate 34 into contact with the first solution 36 which is now exactly saturated with the semiconductor material. The heating means for the furnace tube is then turned off to cool the furnace boat 12 and its contents. Cooling of the exactly saturated first solution 36 causes some of the semiconductor material in the first solution 36 to precipitate and deposit on the surface of the substrate 34 to form a first epitaxial layer. During the deposition of the semiconductor material some of the conductivity modifiers in the first solution 36 become incorporated in the lattice of the first epitaxial layer to provide the first epitaxial layer with a desired conductivity type. Since the first solution 36 is in the form of a thin layer, the cooling of the first solution 36 results only in the deposition of the precipitated semiconductor material on the surface of the substrate 34 with only a minimum of undesirable platelets being formed in the solution. Also, since the first solution is small in volume, only a small amount of the semiconductor material is deposited on the substrate 34 per degree drop in temperature so that a thin epitaxial layer of the semiconductor material can be easily deposited on the substrate.

Cooling the first solution 36 to deposit the epitaxial layer on the substrate 34 also cools the second solution 38. Since the second solution 38 is also exactly saturated with the semiconductor material, the cooling of the second solution causes some of the semiconductor material in the second solution 38 to precipitate and deposit back on the body 32. This maintains the second solution 38 exactly saturated with the semiconductor material even though the temperature of the solution has been lowered. The slide 22 is now again moved in the direction of the arrow 40 to move the substrate 34 with the first epitaxial layer thereon from the first well 14 into the second well 16. this brings the surface of the first epitaxial layer into contact with the second solution 38 which is exactly saturated with the semiconductor material at the then temperature of the solution. Further cooling of the furnace boat 12 and its contents causes some of the semiconductor material in the exactly saturated second solution 38 to precipitate and deposit on the first epitaxial layer to form a second epitaxial layer. Also, some of the conductivity modifier in the second solution 38 becomes incorporated in the lattice of the second epitaxial layer to provide the second epitaxial layer with a desired conductivity type. Since the second solution 38 is also in the form of a thin layer, the cooling of the second solution also results in the deposition of the precipitated semiconductor material with only a minimum of undesirable platelets being formed in the solution. Also, a thin epitaxial layer can be easily deposited from the small volume of the second solution. The slide 22 is then again moved in the direction of the arrow 40 to move the substrate 34 with the two epitaxial layers thereon from the well 16 to the empty well 18 where the substrate can be removed from the slide.

Thus, the method of the present invention provides a thin layer of small volume of the deposition solution which will cover the entire surface of the substrate on which the epitaxial layer is to be deposited. this results in the precipitation and deposition of the semiconductor material on the substrate with the formation of only a minimum amount of platelets of the semiconductor material in the solution which do not adversely affect the surface morphology of the substate so as to provide epitaxial layers having smooth, even surfaces. Also, it provides for ease of depositing thin epitaxial layers of the semiconductor material. However, this embodiment of the method of the present invention has one drawback. When the semiconductor body 32 is moved out of the first well 14 after the first solution 36 is exactly saturated with the semiconductor material, there is a tendency for some of the first solution 36 to adhere to the semiconductor body 32 and be carried with the semiconductor body 32 into the second well 16. This not only reduces the volume of the first solution which is already of small volume, but the portion of the first solution carried with the semiconductor body 32 can contaminate the second solution 38 which may contain a conductivity modifier or other ingredients which are different from that contained in the first solution.

Figure 2:
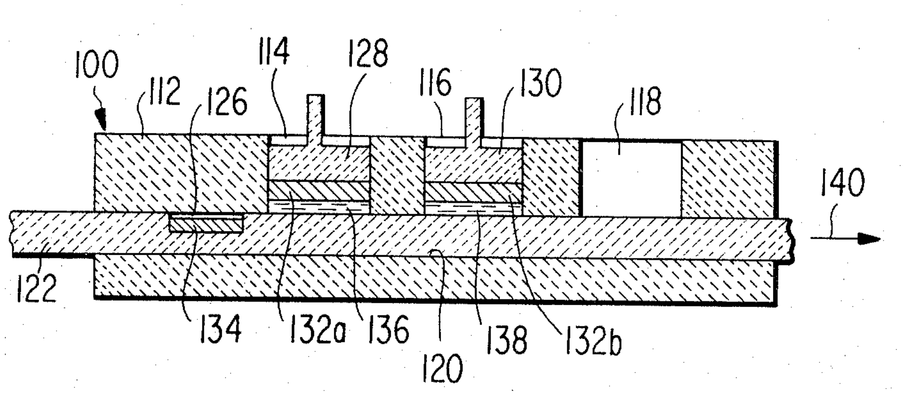
FIG. 2 is a cross-sectional view of an apparatus suitable for carrying out a second embodiment of the method of the present invention.

Referring to FIG. 2 there is shown an apparatus, generally designated as 100, suitable for carrying out a second embodiment of the method of the present invention which overcomes the drawback of the embodiment described above. The apparatus 100 comprises a refractory furnace boat 112 of an inert material having three, spaced wells 114, 116 and 118 in its upper surface. A slide 122 of a refractory material movably extends through a passage 120 which extends longitudinally through the boat 112 and across the bottoms of the wells 114, 116 and 118 so that the top surface of the slide forms the bottom surfaces of the wells. The slide 122 has a substrate receiving recess 126 in its upper surface adjacent one end of the slide. Separate weights 128 and 130 of an inert material are provided in the wells 114 and 116 respectively.

To carry out the second embodiment of the method of the present invention, a small volume of separate charges are placed in each of the first and second wells 114 and 116 respectively. The charges are of the same composition as the charges used in the one embodiment of the method of the present invention previously described in that they include a mixture of the semiconductor material of the epitaxial layer to be deposited, a metal solvent for the semiconductor material and conductivity modifier. Separate bodies **132*a* and 132*b* of the same semiconductor material as contained in the charges are placed in the wells 114 and 116 respectively over the charges. The weights 128 and 130 are placed in the wells 114 and 116 respectively over the bodies 132*a* and 132*b* respectively. If the metal solvent used in the charges is in a liquid form, the weights 128 and 130 apply a force on the charges which spreads the charges over the bottom of the wells to form thin layers of the charges. A flat substrate 134 of a material suitable for epitaxial deposition is placed in the recess 126**.

As in the one embodiment of the method of the present invention, the loaded furnace boat 112 is placed in a furnace tube and a flow of high purity hydrogen is provided through the furnace tube and over the furnace boat 112. The heating means for the furnace tube is turned on to heat the contents of the furnace boat 112 to a temperature above the melting temperature of the ingredients of the charges and this temperature is maintained long enough to insure complete melting and homogenization of the ingredients of the charges. If the metal solvent used in the charges was in solid form when placed in the wells, as it becomes molten upon heating, the force applied to the charges by the weights 128 and 130 causes the molten charge to spread across the bottom surfaces of the wells to form thin layers. Thus, the charges become first and second solutions 136 and 138 of the semiconductor material and the conductivity modifier in the molten metal solvent. The small volume first and second solutions 136 and 138 are prevented from balling-up and are maintained as thin layers extending over the entire bottoms of the wells 114 and 116 by the force applied by the weights 128 and 130. Since the amount of the semiconductor material initially included in each of the charges was not enough to saturate the metal solvent, as the charges are heated to form the solutions 136 and 138, some of the semiconductor material of each of the bodies **132*a* and 132*b*** dissolves in the respective solutions to exactly saturate the solutions at the temperature to which the solutions are initially heated.

The slide 122 is then moved in the direction of the arrow 140 until the substrate 134 is within the first well 114. This brings the surface of the substrate 134 into contact with the first solution 136 which is exactly saturated with the semiconductor material. The heating means for the furnace tube is then turned off to cool the furnace boat 112 and its contents. Cooling of the exactly saturated first solution 136 causes some of the semiconductor material in the first solution 136 to precipitate and deposit on the surface of the substrate 134 to form a first epitaxial layer. During the deposition of the semiconductor material some of the conductivity modifiers in the first solution 136 become incorporated in the lattice of the first epitaxial layer to provide the first epitaxial layer with a desired conductivity type. Since the first solution is in the form of a thin layer, the cooling of the first solution 136 results only in the deposition of the precipitated semiconductor material on the surface of the substrate 34 with only a minimum of undesirable platelets being formed in the solution. Thus, the first epitaxial layer has a smooth, even surface. Also, since the first solution is small in volume, a thin epitaxial layer of the semiconductor material can be easily deposited on the substrate.

Cooling the first solution 136 to deposit the epitaxial layer on the substrate 134 also cools the second solution 138. Since the second solution 138 is also exactly saturated with the semiconductor material the cooling of the second solution causes some of the semiconductor material in the second solution to precipitate and deposit back on the body **132*b*. This maintains the second solution 138** exactly saturated with the semiconductor material even though the temperature of the solution has been lowered.

The slide 122 is now again moved in the direction of the arrow 140 to move the substrate 134 with the first epitaxial layer thereon from the first well 114 into the second well 116. This brings the surface of the first epitaxial layer into contact with the second solution 138 which is exactly saturated with the semiconductor material at the then temperature of the solution. It has been found that when the substrate 134 is moved out of the first well 114, the first solution 136 has a greater tendency to adhere to the semiconductor body **132*a* then to the smooth, even surface of the epitaxial layer on the substrate 134. Thus, little, if any, of the first solution is carried with the substrate 134 so that there is no adverse contamination of the second solution 138 when the substrate 134 comes into the second well 116. Thus, the semiconductor body 132*a* not only serves to maintain the first solution exactly saturated with the semiconductor material but also prevents removal of any undesirable amount of the first solution with the substrate 134** so as to overcome the one drawback of the one embodiment of the method of the present invention.

When the substrate 134 is within the second well 116, further cooling of the furnace boat 112 and its contents causes some of the semiconductor material in the exactly saturated second solution to precipitate and deposit on the first epitaxial layer to form a second epitaxial layer. Also, some of the conductivity modifiers in the second solution 138 becomes incorporated in the lattice of the second epitaxial layer to provide the second epitaxial layer with a desired conductivity type. Since the second solution 138 is also in the form of a thin layer, the cooling of the second solution also results in the deposition of the precipitated semiconductor material with only a minimum of undesirable platelets being formed in the solution. Thus, the second epitaxial layer has a smooth, even surface. Aslo, a thin epitaxial layer can be easily deposited from the small volume of the second solution.

The slide 122 is then again moved in the direction of the arrow 140 to move the substrate 134 with the two epitaxial layers thereon from the well 116 to the empty well 118 where the substrate can be removed from the slide. When the substrate 134 is moved from the second well 116, the second solution 138 adheres to the semiconductor body **132*b*** rather than the smooth surfaces of the second epitaxial layer so that little if any, of the second solution is carried away on the substrate. This prevents the formation of any rough spots on the surface of the second epitaxial layer. Thus, this second embodiment of the method of the present invention provides for the deposition of the epitaxial layers from thin layers of small volumes of the deposition solutions so as to provide the deposition of epitaxial layers having smooth, even surfaces. In addition, this second embodiment eliminates any adverse contamination of the solutions by preventing any substantial amount of the solutions from being carried out of the wells by the substrate.

Figure 3:
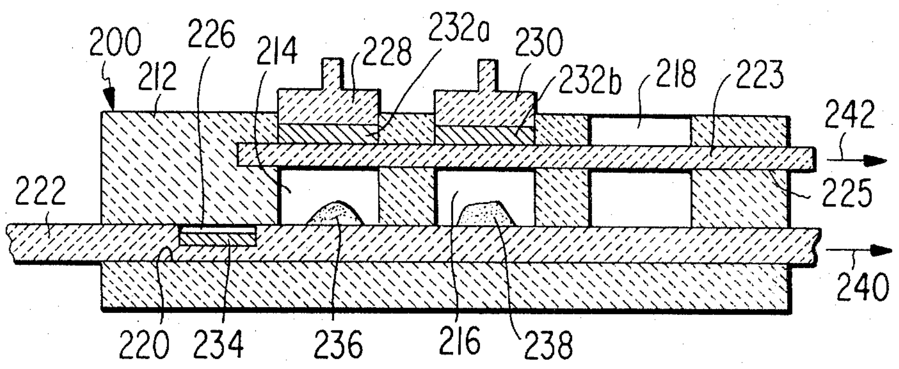
FIGS. 3–5 are cross-sectional views of an apparatus suitable for carrying out a third embodiment of the method of the present invention during various steps of the third embodiment of the method.

Referring to FIG. 3, there is shown an apparatus, generally designated as 200, which is suitable for carrying out a third embodiment of the method of the present invention. The apparatus 200 comprises a refractory furnace boat 212 of an inert material having three, spaced wells 214, 216 and 218 in its upper surface. A slide 222 of a refractory material movably extends through a passage 220 which extends longitudinally through the boat 212 and across the bottoms of the wells 214, 216 and 218 so that the top surface of the slide 222 forms the bottom surfaces of the wells. The slide 222 has a substrate receiving recess 226 in its upper surface adjacent one end of the slide. A second slide 223 movably extends through a passage 225 which extends longitudinally through the boat 212 and crosses each of the wells 214, 216 and 218 a distance spaced above the bottoms of the wells. Separate weights 228 and 230 of an inert material are provided in the wells 214 and 216 respectively.

To carry out the third embodiment of the method of the present invention, the weights 228 and 230 and the second slide 223 are removed from across the first and second wells 214 and 216 and a small volume of separate charges are placed in each of the first and second wells 114 and 116. The charges are of the same composition as the charges used in the one embodiment of the method of the present invention previously described in that they include a mixture of the semiconductor material of the epitaxial layer to be deposited, a metal solvent for the semiconductor material and a conductivity modifier. The second slide 223 is then moved back across the first and second wells 214 and 216. Separate bodies **232*a* and 232*b* of the same semiconductor material as contained in the charges are placed in the wells 214 and 216 on the top surface of the second slide 223 as shown in FIG. 3. The weights 228 and 230 are placed in the wells 214 and 216 respectively on the bodies 232*a* and 232*b* respectively. A flat substrate 234 of a material suitable for epitaxial deposition is placed in the recess 226**.

As in the other embodiments of the method of the present invention, the loaded furnace boat 212 is placed in a furnace tube and a flow of high purity hydrogen is provided through the furnace tube and over the furnace boat 212. The heating means for the furnace tube is turned on to heat the contents of the furnace boat 212 to a temperature above the melting temperature of the ingredients of the charges. This temperature is maintained long enough to insure complete melting and homogenization of the ingredients of the charges. Also, the space around the charges allows for out gassing of the charges so as to remove undesirable contaminants from the charges. Thus, the charges become first and second solutions 236 and 238 of the semiconductor material and the conductivity modifiers in the molten metal solvent. Since the solutions 236 and 238 are of small volume, as shown in FIG. 3, they ball-up because of the surface tension of the metal solvent.

Figure 4:
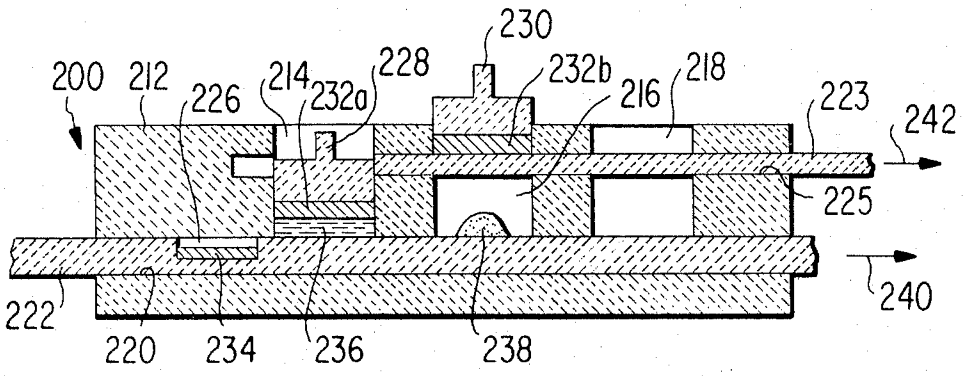

The second slide 223 is then moved in the direction of the arrow 242 in FIG. 3 until the second slide is completely out of the first well 214. As shown in FIG. 4, this permits the body 232a and the weight 228 in the first well 214 to drop down on the first solution 236. The force of the weight 228 on the first molten solution causes the solution to spread out over the bottom of the first well as a thin layer. Since the amount of the semiconductor material initially included in the first solution 236 was not enough to saturate the molten solvent, when the semi-conductor body 232a drops into contact with the heated first solution, some of the semiconductor material of the body dissolves in the first solution until the first solution is exactly saturated with the semiconductor material at the then temperature of the solution.

The first slide 222 is then moved in the direction of the arrow 240 until the substrate 234 is within the first well 214. This bridges the surface of the substrate 234 into contact with the first solution 236 which is exactly saturated with the semiconductor material. The temperature of the furnace tube is then lowered so as to cool the furnace boat 212 and its contents. Cooling of the exactly saturated first solution 236 causes some of the semiconductor material in the first solution to precipitate and deposit on the surface of the substrate 234 to form a first epitaxial layer. Some of the conductivity modifiers in the first solution become incorporated in the lattice of the first epitaxial layer to provide the first epitaxial layer with a desired conductivity type. Since the first solution is in the form of a thin layer, the cooling of the first solution 236 results only in the deposition of the precipitated semiconductor material with only a minimum of platelets being formed in the solution so that the first epitaxial layer has a smooth even surface.

Figure 5:
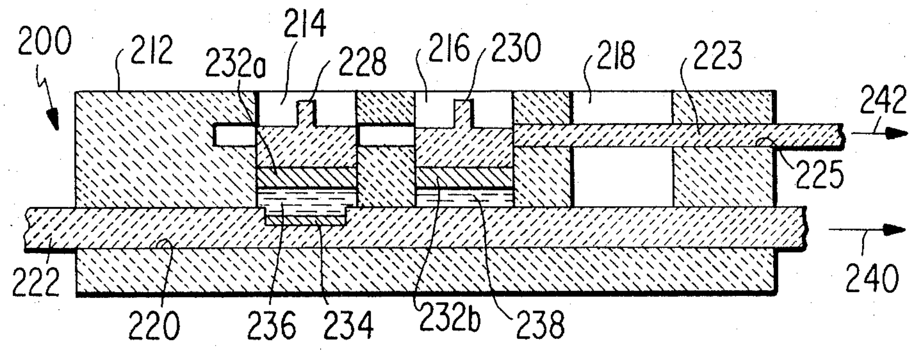

The second slide 223 is then again moved in the direction of the arrow 242 until the second slide is completely out of the second well 216. As shown in FIG. 5, this permits the semiconductor body 232b and the weight 230 in the second well 216 to drop down on the second solution 236. The force of the weight 230 on the second solution 238 causes the solution to spread out over the bottom of the second well as a thin layer. Since the amount of the semiconductor material initially included in the second solution 238 was not enough to saturate the molten solvent, when the semiconductor body 232b drops into contact with the second solution, some of the semiconductor material of the body dissolves in the second solution until the second solution is exactly saturated with the semiconductor material at the then temperature of the second solution.

The first slide 222 is then again moved in the direction of the arrow 240 to move the substrate 234 with the first epitaxial layer thereon from the first well 214 into the second well 216. This brings the surface of the first epitaxial layer into contact with the second solution 238. As in the second embodiment of the method of the present invention, when the substrate 234 is moved out of the first well 214, the first solution 236 has a greater tendency to adhere to the semiconductor body 232a than to the smooth, even surface of the first epitaxial layer so that little, if any, of the first solution is carried with the substrate 234. Thus, there is no adverse contamination of the second solution when the substrate 234 comes into the second well 216. The temperature of the furnace tube is further lowered to further cool the furnace boat 212 and its contents. Cooling of the exactly saturated second solution 238 causes some of the semiconductor material in the second solution to precipitate and deposit on the first epitaxial layer to form a second epitaxial layer. Some of the conductivity modifiers in the second solution 238 become incorporated in the lattice of the second epitaxial layer to provide the second epitaxial layer with a desired conductivity type. Since the second solution is also in the form of a thin layer, the cooling of the second solution results only in the deposition of the precipitated semiconductor material with a minimum formation of any platelets so that the second epitaxial layer has a smooth, even surface.

The first slide 222 is now again moved in the direction of the arrow 240 to move the substrate 234 with the two epitaxial layers thereon from the second well 216 to the empty well 218 where the substrate can be removed from the slide. When the substrate 234 is moved from the second well 216, the second solution 238 adheres to the semiconductor body 232b rather than to the smooth surface of the second epitaxial layer so that little, if any of the second solution is carried away on the substrate. Thus, the smooth, even surface of the second epitaxial layer is maintained. This third embodiment of the method of the present invention has all of the advantages of the second embodiment, previously described. However, it has the additional advantage that it allows for outgassing of the solutions as they are heated so as to permit removal of many undersirable contaminants from the solutions.

Although the embodiments of the method of the present invention have been described with regard to depositing two successive epitaxial layers, each can be used to deposit either a single epitaxial layer or more than two epitaxial layers. To deposit a single epitaxial layer, only one solution is used with the substrate being brought into contact with the solution after the solution is exactly saturated by the semiconductor body. To deposit more than two epitaxial layers on the substrate, the furnace boat is provided with a separate well for each solution from which an epitaxial is to be deposited and a weight is provided in each well. The epitaxial layers are deposited on the substrate in succession in the same manner as previously described by moving the substrate from one well to the next.

Thus, there is provided by the present invention various embodiments of a method of epitaxially depositing a semiconductor material from solutions of small volumes which cover the entire surface on which the epitaxial layers are to be deposited. This results in the prevention of the formation of platelets of the semiconductor material in the solutions during the deposition step so that the epitaxial layer deposited has a smooth, even surface. Also, this provides for ease of depositing thin epitaxial layers of the semiconductor material. In addition, the second and third embodiments of the method of the present invention provide for little, if any, of the solutions being carried away with the substrate when the substrate is removed from the solution This prevents any adverse contamination of a following solution into which the substrate may be brought and maintains the last epitaxial layer deposited with a smooth, even surface. The third embodiment also provides for the outgassing of the solutions as they are heated so as to remove undersirable contaminants.

We claim:

1. A method of depositing an epitaxial layer of a semiconductor material on the surface of a substrate comprising the steps of:

a. forming in a defined space having a bottom surface a solution of the semiconductor material dissolved in a molten solvent which solution is of a sufficiently small volume that the surface tension of the materials of the solution is large enough to prevent the solution from spreading over the entire bottom surface of the defined space, b. applying a force to a first surface of said solution so as to spread the solution over the entire bottom surface of the defined space as a relatively thin layer of said solution, c. bringing a surface of said substrate into contact with a second surface of said solution layer which is opposite to the first surface of the solution layer, d. cooling said solution to precipitate said semiconductor material from said solution and deposit said semiconductor material on said surface of the substrate, and removing said substrate with the epitaxial layer thereon from said solution.

2. The method in accordance with claim 1 in which the force is applied to the solution by placing a weight on the solution.

3. The method in accordance with claim 2 in which the confined space has a bottom surface of an area at least as large as the area of the surface of the substrate on which the epitaxial layer is deposited and the weight applies a force on the solution so as to spread the solution as a thin layer over the entire bottom surface of the confined space.

4. The method in accordance with claim 3 in which prior to bringing the surface of the substrate into contact with the solution a body of the semiconductor material is brought into contact with the solution so as to exactly saturate the solution at the then temperature of the solution, and then the surface of the substrate is brought into contact with the exactly saturated solution.

5. The method in accordance with claim 4 in which the body of the semiconductor material is brought into contact with the second surface of the solution.

6. The method in accordance with claim 4 in which the body of the semiconductor material is placed between the solution and the weight so as to contact the first surface of the solution.

7. The method in accordance with claim 3 in which a plurality of epitaxial layers of a semiconductor material are deposited in succession on the substrate by providing in a plurality of separate confined spaces separate solutions of the semiconductor material in a molten solvent, placing a separate weight on each of said solutions to spread the solution as a thin layer over the entire bottom surface of its respective confined space, bringing the substrate into each of the solutions in succession, and while the substrate is in each of said solutions cooling the solution to deposit an epitaxial layer of the semiconductor material from said solution on said substrate.

8. The method in accordance with claim 7 in which prior to bringing the substrate into each of the solutions a body of the semiconductor material is brought into contact with the solution so as to exactly saturate the solution, and then the substrate is brought into contact with the exactly saturated solution.

9. The method in accordance with claim 8 in which a single body of the semiconductor material is brought into contact with the second surface of each of the solutions in succession just prior to bringing the substrate into the respective solutions.

10. The method in accordance with claim 8 in which a separate body of the semiconductor material is placed between each of the solutions and its respective weight so as to contact the first surface of its respective solution.

11. The method in accordance with claim 10 in which each of the bodies of the semiconductor material and its respective weight are brought into contact with their respective solutions in succession just prior to bringing the substrate into the respective solutions.

12. A method of depositing on a substrate a plurality of epitaxial layers of a semiconductor material in succession using a furnace boat having a plurality of spaced wells in a surface thereof and a substrate carrier slide extending through the boat and across the bottoms of the wells so that a surface of the slide forms the bottoms of the wells comprising the steps of:

a. providing in each of at least two of said wells a separate solution of a semiconductor material dissolved in a molten metal solvent, each of said solutions being of a sufficiently small volume that the surface tension of the materials of the solution is large enough to prevent the solution from spreading out over the entire bottom surface of its respective well, b. providing in each of the wells which contains a solution a weight which applies a force on the solution and spreads the solution over the entire bottom surface of the well as a thin layer, c. providing a substrate in a recess in said surface of said substrate carrier slide, d. moving said slide so as to bring said substrate into each of said wells in succession, and e. while the substrate is in each of said wells cooling the solution in said well to deposit an epitaxial layer of the semiconductor material from said solution on said substrate.

13. The method in accordance with claim 12 in which prior to bringing the substrate into a well a body of the semiconductor material in the solution is brought into contact with the solution so as to exactly saturate the solution, and then the substrate is brought into the well.

14. The method in accordance with claim 13 in which the body of the semiconductor material is in a recess in said surface of the substrate carrier slide so that the body is moved into each well prior to the substrate and is moved out of the well when the substrate is moved into the well.

15. The method in accordance with claim 13 in which a separate body of the semiconductor material is provided in each of the wells between the solution and the weight.

16. The method in accordance with claim 15 including a second slide extending through the boat and across the wells spaced from the substrate carrier slide, each body of the semiconductor material and its respective weight are mounted on the second slide and are brought into contact with the respective solution prior to moving the substrate into the well by moving the second slide from across the respective well and allowing the body and the weight to drop onto the solution.

* * * * *